United States Patent
Leu

(10) Patent No.: US 7,243,413 B2
(45) Date of Patent: Jul. 17, 2007

(54) FIXING TOOL FOR QUICKLY SETTING UP A SECURE DEVICE

(75) Inventor: Chii-Ming Leu, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 426 days.

(21) Appl. No.: 10/883,692

(22) Filed: Jul. 6, 2004

(65) Prior Publication Data
US 2006/0005377 A1 Jan. 12, 2006

(51) Int. Cl.
*B23P 19/00* (2006.01)
(52) U.S. Cl. ............... 29/729; 29/739; 29/740; 29/744; 29/832; 257/719; 361/704; 361/709; 165/80.3
(58) Field of Classification Search .......... 29/729, 29/739–743, 752, 762, 758, 764, 268, 278, 29/426.6; 361/703–712, 718–719; 257/718
See application file for complete search history.

(56) References Cited

U.S. PATENT DOCUMENTS

| | | | | |
|---|---|---|---|---|
| 2,126,225 A | * | 8/1938 | Simons | 29/243.56 |
| 5,161,292 A | * | 11/1992 | Kurtyak et al. | 29/243.56 |
| 5,730,210 A | * | 3/1998 | Kou | 165/80.3 |
| 6,023,832 A | * | 2/2000 | Boe | 29/426.6 |
| 6,496,371 B2 | * | 12/2002 | Winkel et al. | 361/703 |
| 6,600,655 B1 | * | 7/2003 | Dailey et al. | 361/719 |
| 7,057,897 B2 | * | 6/2006 | Leu | 361/704 |
| 2006/0005377 A1 | * | 1/2006 | Leu | 29/729 |

* cited by examiner

Primary Examiner—Minh Trinh

(57) ABSTRACT

A fixing tool for quickly setting up a secure device with an engaging member and a secure unit is used for mounting the secure device to an electronic component. The fixing tool includes a main member, a driving member with an extending part pivotally connected to the main member and an ejection member with an ejecting part disposed at the bottom cover of the main member. The bottom cover defines a moving direction and a rotating direction and the driving member rotates between a prior-trigger position and a trigger position along the rotating direction and the ejection member moves between a prior-ejecting position and an ejection position. When the driving member is disposed at the prior-trigger position, the ejection member is at the prior-ejecting position. When the driving member is disposed at the trigger position, the ejection member is disposed at the ejection position and the engaging member in the containing chamber is pushed by the ejection member to join with the secure unit.

9 Claims, 5 Drawing Sheets

FIXING TOOL FOR QUICKLY SETTING UP A SECURE DEVICE

BACKGROUND OF THE INVENTION

1. Field of Invention

The present invention is related to a fixing tool for quickly setting up a secure device and particularly to a fixing tool for an engaging member being joined to a secure unit by an ejecting member, which is actuated by a driving member.

2. Brief Description of Related Art

Due to technology progressing rapidly, the integrated circuit has been capable of being made with thinness, lightness, shortness and smallness. Relatively, each electronic device can perform huge and more complicated functions and it consumes much more power so that more heat is generated and a heat dissipation device such as a radiator has to be mounted to the electronic device for removing the heat in order to keep operation of the whole electronic system normally Referring to FIGS. 1, 2 and 3, the conventional heat dissipation device 100, which is mounted to a central processing unit (not shown) in a notebook computer, includes a cooling module 1 and three secure units 2. The cooling module 1 further includes a main element 11 and a cooling unit 12, which is disposed at the bottom of the main element 11 and faces the central processing unit. The cooling unit 12 further includes a heat guide plate 121 attached to the central processing unit. The main element 11 has three connecting seats 111 spacing apart from each other and surrounding the heat guide plate 121. Each of the connecting seats 111 has a vertical central through hole 112 with an inner diameter at the upper part thereof being greater than that at the lower part thereof and an intersection shoulder 113 is disposed between the two inner parts. Each of the secure unit 2 further includes a screw 21, a spring 223 and a C-type retaining ring 23. The screw 21 further includes a screw head and a screw rod joined to the screw head. The screw rod has a large diameter section 211, a small diameter section 212 and an annular recess 213 at the intersection of the large diameter section 211 and the small diameter section 212. The annular recess 213 engages with the C-type retaining ring 23. The screw rod is inserted into the through hole 112 and slightly longer than the through hole 112 so that part of the small diameter section 212 extends outward the through hole 112.

The spring 22 is disposed to surround the screw 21 before the screw 21 is inserted into the through hole 112. Both the small diameter section 212 and the annular recess 213 of the screw 21 extend outward the through hole 112 while the secure device being set up. Meanwhile, an end of the spring 22 is biased against the screw head of the screw 21 and the other end of the spring 22 is biased against the shoulder part 113 of the through hole 112 respectively so that the spring 22 is partly subjected to a compression force. The C-type retaining ring 23 is engaged to the annular recess 213. Once a foreign force, which exerts to the spring 22 at the time of the secure unit 2 being mounted, is relieved, the C-type retaining ring 23 is pressed by the restoring force of the spring 22 against the bottom of the connecting seat 111 to complete the job of setting up the secure unit 2.

The C-type retaining ring 23 in the preceding conventional device is engaged to the annular recess 213 manually but it is very inconvenient that the small and flat retaining ring 23 has to be picked up carefully before engaging with the annular recess 213. Further, it is very easy for the C-type retaining ring 23 to engage with the annular recess 231 incompletely due to the finger being unable to hold the opening of the C-type retaining ring 23 evenly or it is very likely to postpone time for the setting up job caused by the C-type retaining ring 23 falling down to the ground. On the other hand, it is easy for a group of C-type retaining rings to attract each other due to static electric charges such that picking up one of the C-type retaining rings becomes very tedious. In addition, the force being exerted excessively with an unevenly positioned C-type retaining ring may result in injury of hand once the hand hits the electronic component. In this way, worse production efficiency is obtained with increased production cost.

SUMMARY OF THE INVENTION

Accordingly, an object of the present invention is to provide a fixing tool for quickly setting up a secure device.

The fixing tool for quickly setting up a secure device according to the present invention is capable of mounting the secure device, which is provided with an engaging member and a secure unit, to an electronic component. The fixing tool includes a main member with an upper end, providing a bottom cover and defining a moving direction and a rotational direction; a driving element with a push part, being pivotally connected to the upper end of the main member for being able to rotate between a prior-trigger position and a trigger position; and an ejection member with an ejecting part, being provided at the bottom cover and connected to the push part for being able to move between a prior-ejecting position and an ejection position.

When the ejection member is located at the prior-ejecting position in case of the driving member being located at the prior-trigger position, the ejection member is located at the ejection position to push the engaging member, which is disposed at the bottom cover, to engage with the secure unit, which is attached to the electronic component, so as to mount the secure device to the electronic component in case of the driving member being located at the trigger position.

The fixing tool for quickly setting up at least a secure device according to the present invention is provided for the secure device to be mounted to the electronic component quickly so that possible injury can be avoided during doing the setting up job in addition to less time for setting up the secure device and higher production capability for assembling the cooling module. Besides, the engaging member can be received in the main member to overcome dificiency of mess workshop and decrease inconvenience of picking up the C-type retaining ring.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE PREFERRED EMBODIMENT

Figure 1:
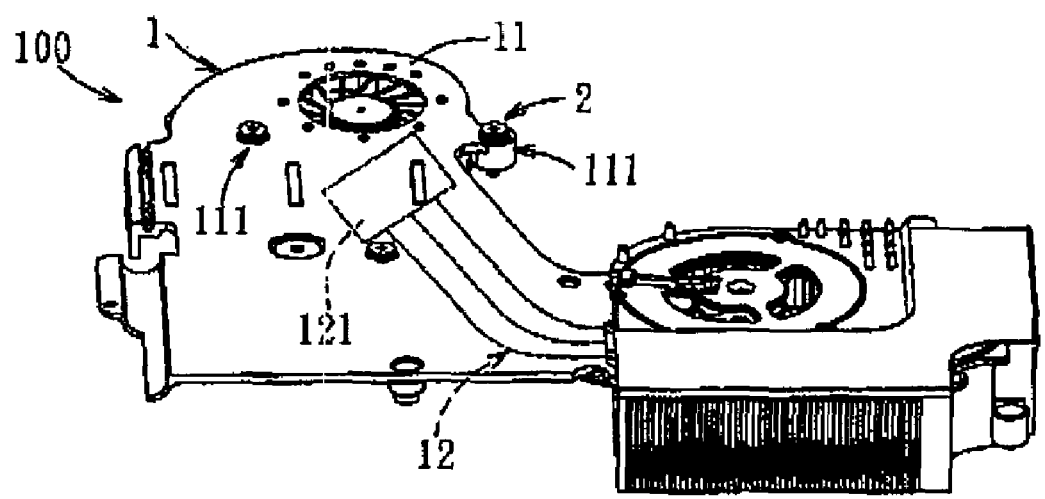
FIG. 1 is a perspective view of the conventional radiator.
Figure 2:
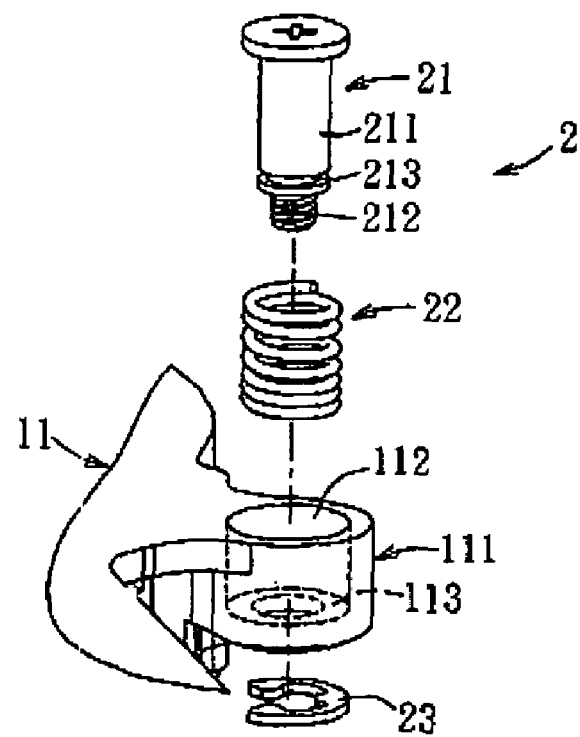
FIG. 2 is an exploded perspective view of the secure unit of the radiator shown in FIG. 1.
Figure 3:
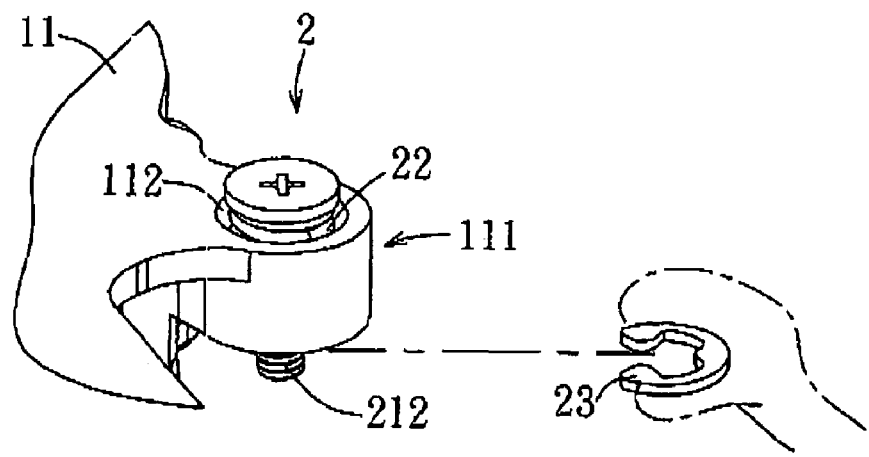
FIG. 3 is a perspective view illustrating how the conventional secure unit being set up.
Figure 4:
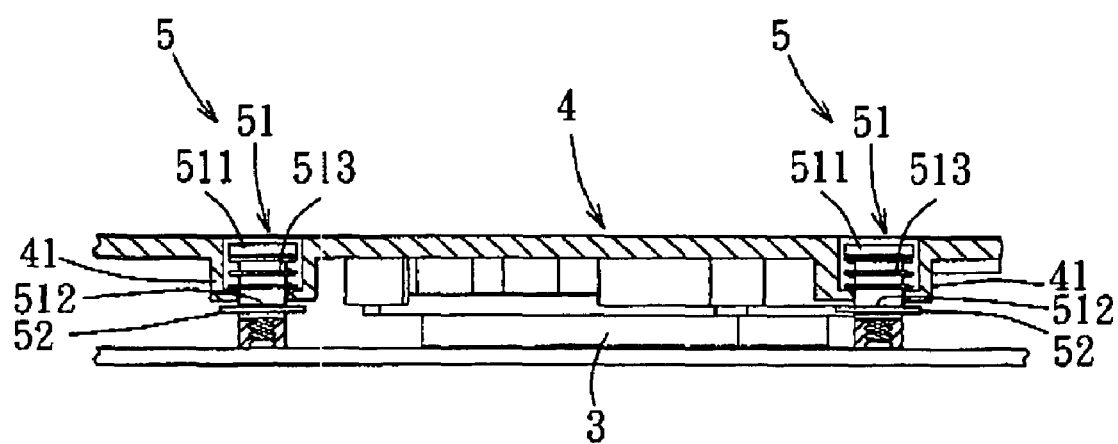
FIG. 4 is a side view of a radiator being attached to a central processing unit.
Figure 5:
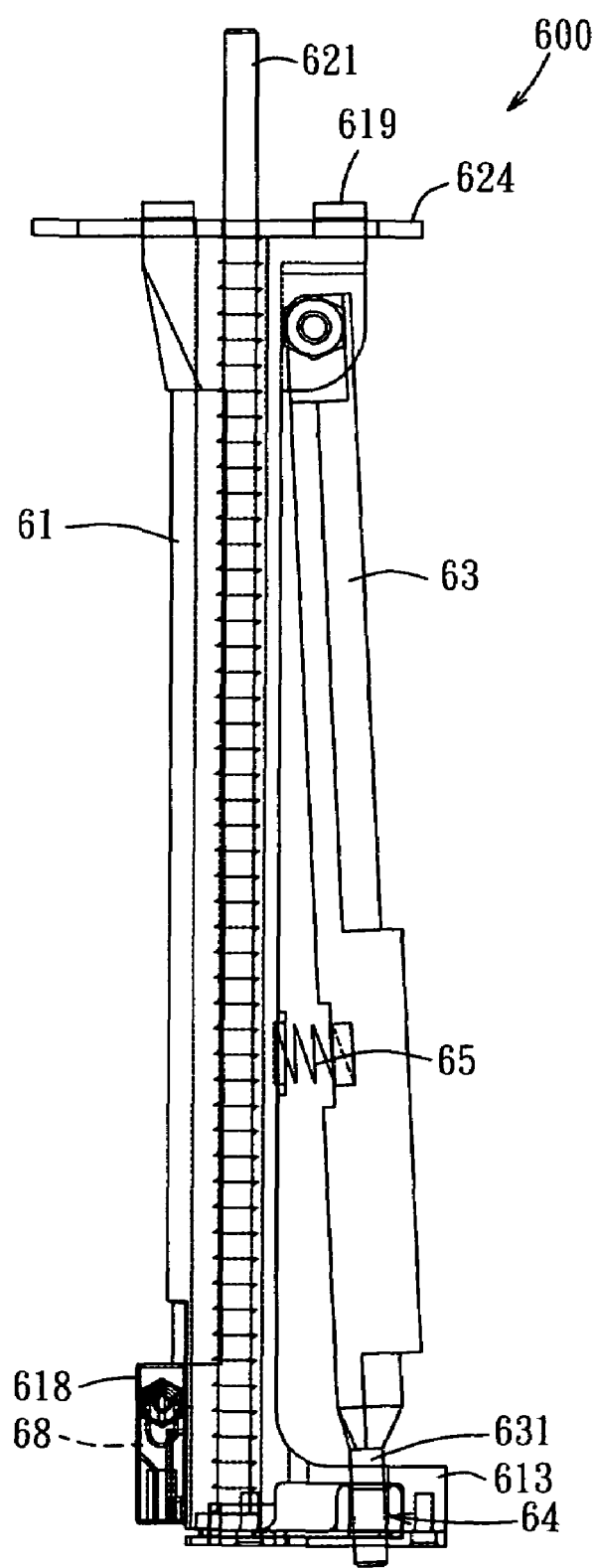
FIG. 5 is a perspective view of a fixing tool for quickly setting up a secure device according to the present invention in a preferred embodiment thereof.
Figure 6:
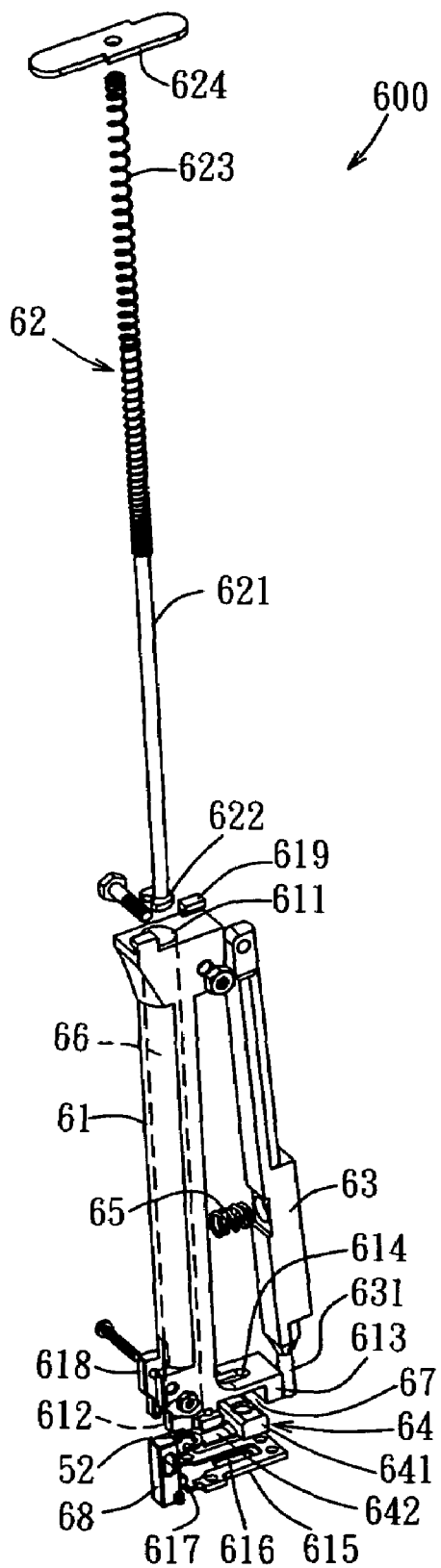
FIG. 6 is an exploded perspective view of the preferred embodiment shown in FIG. 5.

Referring to FIGS. 4, 5 and 6, a preferred embodiment of a fixing tool for quickly setting up a secure device according to the present invention is illustrated. The fixing tool 600 of the preferred embodiment is used for setting up the secure device 5 of a radiator 4 on a central processing unit 3. It is noted that the embodiment is only an example for explanation and not for a limitation. In fact, the fixing tool is suitable for setting up a secure device of other electronic components. The secure device 5 is attached to a connecting seat 41 of the radiator 4 and includes a secure unit 51 and an engaging member 52. The secure unit 51 further includes a screw 511 with an annular recess 512 and a spring 513 surrounding the screw 511. The engaging member 52 is a C-type retaining ring 52 being engaged to the annular recess 512. The fixing tool 600 includes a main member 61, a locating unit 62, a drive member 63, an ejecting member 64 and an elastic member 65.

The main member 61 includes an upper opening part 611 and a lower opening part 612 and a containing chamber 66 is defined between the upper and the lower opening part 611, 612. The main member 61 has an extending part 613, which has an L-shaped cross section, from the lower outer surface thereof. The extending part 613 has a central downward piercing hole 614 at the top thereof and is detachably attached with a bottom cover 615. The bottom cover 615 has a central piercing hole 616 corresponding to the through hole 614 and defines a control chamber 67 commonly with the extending part 613. The bottom cover 615 has a press part 617 with a circular end near the lower opening 612. The locating unit 62 includes a spring locating stem 621 being inserted into the containing chamber 66, a pressing plate 622 joined to a lower end of the spring locating stem 621, a coil spring 623 surrounding the locating stem 621 and an upper cover 624 covering the upper opening 611 of the main member 61.

The drive member 63 pivotally connects an end thereof with the main member 61 near the upper opening 611 and has an actuation part 631 being disposed at an opposite position to the connected end. The actuation part 631 is inserted into the piercing hole 614 from the top thereof and penetrates the through hole 616 via the control chamber 67. The piercing hole 614 and the through hole 616 have a depth thereof greater than the length of the actuation part 631 so that the actuation part 631 can move along in the holes 614, 616. The injection member 64 is mounted in the control chamber 67 to connect with the actuation part 631 with a coupling part 641 and the coupling part 641 extends a push part 642 toward the lower opening 612 from an end thereof near the lower opening 612.

The elastic member 65 in the embodiment is a restoring spring 65 with both ends thereof being joined to the main member 61. The elastic member 65 is forced to generate a restoring force for the drive member 63 being able to move back to the original position while the drive member 63 rotates with respect to the main member 61. The elastic member 65 can be any other elastic member such as a spring plate instead of the coil spring.

The fixing tool 600 further includes a locating slide block 68 being inset between two jut pieces 618 on the main member 61 to control one of different kinds of C-type retaining ring 52 being able to engage with the annular recess 619 of the secure unit 51. On the other hand, the main member 61 further includes an engaging part 619 connected to the upper opening part 611 for fixing the top cover 624 of the secure unit 62.

Figure 7:
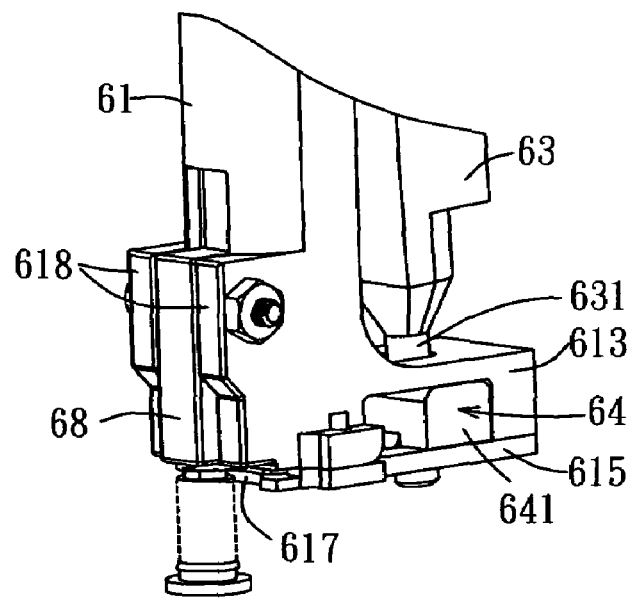
FIG. 7 is a partial perspective view of the preferred embodiment shown in FIG. 5.

Referring to FIG. 7, the locating slide block 68 is adjusted the height thereof in accordance with what the C-type retaining ring is and is fixedly attached between the two jut pieces 618 before being used so as to allow the C-type retaining ring 52 being able to fit with the annular recess 512 of the secure unit 51 in the subsequent operation. Next, the C-type retaining ring 52 is received in the chamber 66 and the locating stem 621 with the coil spring 623 is inserted into the chamber 66. Right at the moment, the press plate 622 is disposed between the C-type retaining ring 52 and the coil spring 623 in a way of the coil spring 623 slightly extending outward the main member 61. Then, the upper cover 624 is provided on the locating stem 621 to compress the spring 623 into the chamber 66 against the engaging part 619 of the main member 61 so as to be caught by the engaging part 619. Meanwhile, the drive member 63 is located at the prior-trigger position and the ejection member 64 is located at a prior-ejecting position.

Figure 8:
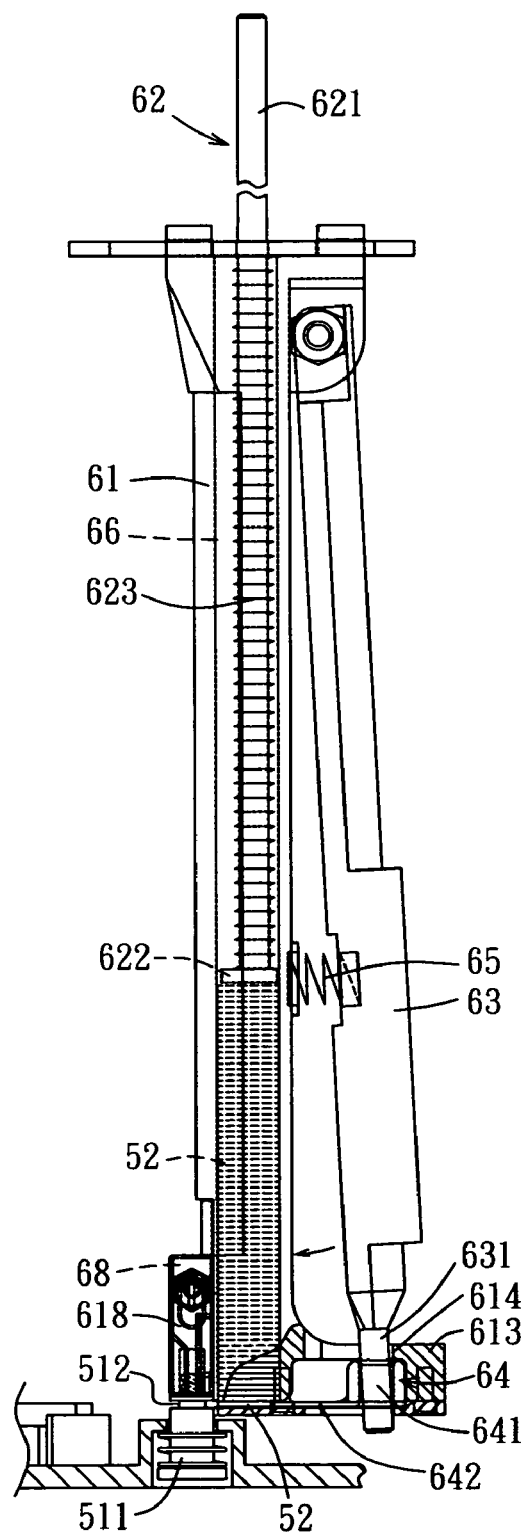
FIG. 8 is a partial perspective sectional view illustrating a drive member being located at a prior-trigger position and a ejection member being located at a prior-ejecting position.
Figure 9:
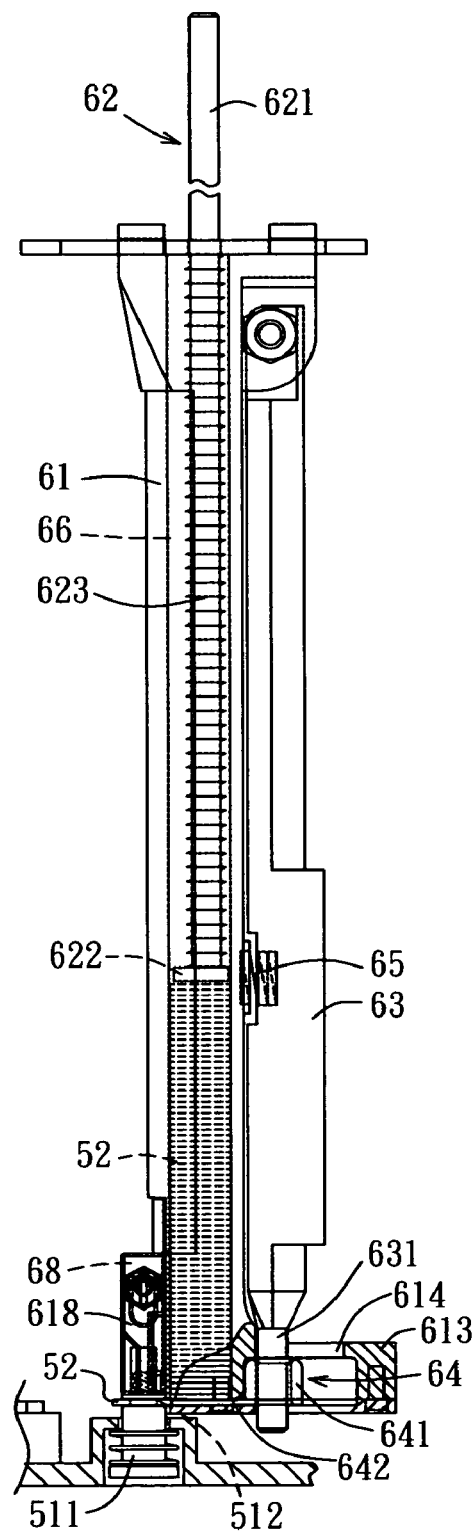
FIG. 9 is a partial perspective sectional view similar to FIG. 8 illustrating the drive member being located at a trigger position and the ejection member being located at an ejecting position with a C-type retaining ring being engaged to an annular recess thereof.

Referring to FIGS. 8 and 9, press the bottom cover 615 against the connecting seat 41 of the radiator 4 at the bottom thereof to allow the tail end and the annular recess 512 of the screw 511 extending outward the connecting seat 41 while in use. Then, the drive member 63 is stirred to approach the main member 61 and to compress the restoring spring 65 and the restoring spring 65 is forced to generate a restoring force. The driving member 63 is rotated to the trigger position from the prior-trigger position and the actuation part 631 actuates the ejection member 64 to move toward the ejection position. Once the push part 642 of the ejection member 64 presses the C-type retaining ring to engage with the annular recess 512, the driving member 63 is disposed at the trigger position and the ejection member 64 is disposed at the ejecting position. After the secure device having been set up, the driving member 63 is released and the restoring force of the restoring spring 65 allows the driving member 63 to move back to the prior-trigger position from the trigger position. In the meantime, the ejection member 64 is back to the prior-ejecting position. The C-type retaining ring 52 in the containing chamber 66 moves downward a distance of thickness thereof due to the restoring force of the coil spring 623 of the locating unit 62.

Other implementation examples are explained hereinafter. The upper opening 611 of the main member 61 can be omitted, the C-type retaining ring 52 can be inserted into the containing chamber 66 via the lower opening 612 and the locating unit 62 can be exempted due to the C-type retaining ring 52 being possible to move downward by way of self-weight during the secure device 5 being set up. Further, the main member 61 can provide a piercing hole at the outer surface thereof for being inserted with the push part 642 of the ejection member 64 so that the extending part 613 can be eliminated. Besides, the C-type retaining ring 52 can be renewably placed on the press part 617 of the bottom cover 615 directly so that the upper opening 611, the lower opening 612 and the containing chamber 66 arranged in the main member 61 can be omitted completely. On the other hand, the function of the elastic member 65 is used for pulling the secure device 5 back to the original position so that basic function of the fixing tool 600 is not affected in case of the elastic member 65 is omitted. In addition, the fixing tool 600 can be fabricated to comply with specific C-type retaining ring so that the locating slide block 68 and the jut pieces 618 can be eliminated.

It is appreciated that the fixing tool for quickly setting up a secure device according to the present invention can allow the C type retaining ring 52 being mounted to the secure unit 51 to save time for setting up the secure device 5 so as to enhance the production efficiency and production capability due to exempting inconvenient manual operation. Further, the locating slide block 68 can be adjusted in accordance with different kinds of C-type retaining rings 52 such that the fixing tool 600 is suitable for various different situations and availability thereof is enhanced significantly. Hence, the secure device can be fabricated with mass production to lower the production cost thereof competitively. On the other hand, it can prevent hands of the operator from injury caused by carelessly touching the electronic component so that probability of interruption of the production lines is reduced greatly and the production efficiency can be well maintained constantly.

While the invention has been described with referencing to the preferred embodiments thereof, it is to be understood that modifications or variations may be easily made without departing from the spirit of this invention, which is defined by the appended claims.

What is claimed is:

1. A fixing tool for quickly setting up at least a secure device, which is provided with an engaging member and a secure unit, and for mounting the secure device to an electronic component, the tool comprising:

a main member with an upper end providing a bottom cover and defining a moving direction and a rotational direction;

a driving element with an actuation part being pivotally connected to the upper end of the main member for being able to rotate between a prior-trigger position and a trigger position; and an ejection member with an ejecting part, being provided at the bottom cover and connected to the actuation part for being able to move between a prior-ejecting position and an ejection position;

whereby, the ejection member is located at the prior-ejecting position in case of the driving member being located at the prior-triggering position; and the ejection member is located at the ejection position to push the engaging member, which is disposed at the bottom cover, to engage with the secure unit, which is attached to the electronic device, in case of the driving member being located at the trigger position, such that the secure device is capable of being mounted to the electronic device.

2. The fixing tool as defined in claim 1, further comprises an elastic member, which has two ends to be joined to the main member and the driving member respectively, to provide a restoring force for the driving member being back to the prior-trigger position.

3. The fixing tool as defined in claim 2, wherein the elastic member is a restoring spring.

4. The fixing tool as defined in claim 1, further comprises a locating slide block, which movably connects with the main member to adjust position of the engaging member, such that the engaging member is capable of engaging with the secure unit.

5. The fixing tool as defined in claim 1, wherein the main member further has a containing chamber and a lower opening under the containing chamber and the engaging member is placed in the containing chamber in advance for being used continuously.

6. The fixing tool as defined in claim 5, wherein the main member further provides an upper opening above the containing chamber for the engaging member being received in the containing chamber via the upper opening.

7. The fixing tool as defined in claim 6, further comprises a locating unit to guide the engaging member into the containing chamber.

8. The fixing tool as defined in claim 7, wherein the locating unit has a spring locating stem, a press plate connecting with the lower end of the locating stem, a coil spring surrounding the locating stem and an upper cover detachably connecting with the locating stem and covering the upper opening.

9. The fixing tool as defined in claim 8, wherein the main member further has an engaging part at the upper lateral side thereof against the upper cover so that the upper cover is joined to the main body.

* * * * *